(12) United States Patent
Sawyers

(10) Patent No.: US 6,543,631 B1
(45) Date of Patent: Apr. 8, 2003

(54) PLATING RACK

(76) Inventor: Charles W. Sawyers, 475 Big Indian Loop, Mooresville, NC (US) 28117

( * ) Notice: Subject to any disclaimer, the term of this patent is extended or adjusted under 35 U.S.C. 154(b) by 0 days.

(21) Appl. No.: 10/010,286

(22) Filed: Nov. 13, 2001

(51) Int. Cl.[7] .............................................. A47B 43/00
(52) U.S. Cl. ..................... 211/205; 211/118; 211/119; 211/163; 204/299.1; 118/500
(58) Field of Search ................ 211/205, 118, 211/119, 163; 204/297.1; 118/500

(56) References Cited

U.S. PATENT DOCUMENTS

| | | | | |
|---|---|---|---|---|
| 2,364,822 A | * | 12/1944 | Schneider | 204/297.09 |
| 3,033,776 A | * | 5/1962 | Rosner | 204/297.09 |
| 4,872,963 A | * | 10/1989 | Van Horn | 118/500 |
| 5,020,677 A | * | 6/1991 | Wirth et al. | 118/500 |
| 5,147,050 A | * | 9/1992 | Cullen | 118/500 |
| 5,908,120 A | * | 6/1999 | Yates et al. | 118/500 |

* cited by examiner

Primary Examiner—Alvin Chin-Shue
Assistant Examiner—Sarah Purol
(74) Attorney, Agent, or Firm—Coats & Bennett, P.L.L.C.

(57) ABSTRACT

A plating rack is provided and is adapted, for example, for use in connection with a physical vapor deposition system for plating components such as plumbing fixtures. The plating rack is adapted to be contained within a plating chamber and includes an elongated main support member. Secured to the elongated support member is a series of axially spaced component support assemblies with each component support assembly adapted to receive and hold an array of components to be plated. Respective components support assemblies are configured such that they include an open side that permits the entire component support assembly to be laterally moved into engagement with the main support member where the component support assembly can be secured thereto. In addition, a support structure is provided for axially adjusting respective component support assemblies on the main support member. Thus, the plating rack can contain various numbers of component support assemblies with the various support assemblies being spaced as desired.

23 Claims, 4 Drawing Sheets

PLATING RACK

FIELD OF THE INVENTION

The present invention relates to plating systems and more particularly for a rack structure that is utilized to support components that are to be plated.

BACKGROUND OF THE INVENTION

In recent years it has become quite popular for manufacturers of various products to plate products or components of the products. For example, in the plumbing industry, it is common for plumbing manufacturers to plate plumbing accessories such as faucets, handles and the like. Plating serves a number of functions. First, it tends to harden the surface of the components and as a result the hardened surfaces tend to resist wear. Finally, plating processes coat the components in an attractive and sometimes distinctive color.

There are various types of plating systems. In the way of an example, there is a system referred to as PVD, "physical vapor deposition." This process basically comprises removing metallic ions from a target or source material and reacting them with a gas to form a ceramic compound which is deposited on the surface of the products or the components. Typically, the PVD process begins with the part or component being hung on a support or holder and placed in an ultrasonic cleaning line in order to clean the component and to eliminate oil, grease and polishing paste residues. The component or parts after being dried are introduced into a vacuum chamber. In the vacuum chamber the part or component first undergoes cleaning by ionic etching under argon. Thereafter, the component or part is generally bombarded with a high density metallic plasma which produces the coating. The coating process is different for various substrate materials. For copper alloys, for example, an electroplated underlayer is usually necessary, whereas with stainless steel or titanium the PVD process is applied directly on the substrate.

It is known in the art to provide plating racks that are utilized to hold and support the products or component being plated. These plating racks are designed and sized so as to be compatible with a vacuum chamber in the case of the PVD system. In any event, the products or components being plated are secured to the plating rack and the plating rack and the supported parts or components are placed within a chamber for plating. The plating racks of the prior art have a number of drawbacks. First, and foremost, they fail to offer the user a great deal of flexibility. Generally speaking, these racks include a series of support rings that are adapted to receive and hold products or components to be plated. However, the support rings are fixed to the rack and are generally not adjustable. When the manufacturer desires to plate new designs, then the manufacturer often has to have new racks custom made to hold and support certain products or components. This is time-consuming, inconvenient and expensive.

There has been and continues to be a need for a plating rack that is more versatile than racks of the prior art. More particularly, there is a need for a plating rack where the individual component support assemblies of the rack can be easily adjusted and interchanged if desired to accommodate the needs of the user.

SUMMARY OF THE INVENTION

The present invention entails a plating rack for supporting components to be plated. The supporting rack includes an elongated main support member. Secured to the elongated main support member is a series of spaced apart component support assemblies. At least one of the component support assemblies includes a frame or ring that extends substantially around the main support member. The frame includes a pair of opposed end portions that are spaced apart and which define an opening therebetween that allows the elongated main support member to pass through the opening when mounting or removing the component support assembly from the main support member. A support structure is provided with the main support member for engaging and supporting respective component support assemblies. To hold and support the individual products or components that are to be plated, an array of component supports are secured to the frames of the respective component support assemblies.

In one particular embodiment of the present invention, the plating rack is particularly adapted to be used in conjunction with a physical vapor deposition (PVD) process. In this case, the plating rack is adapted to be housed or contained within a vacuum chamber. Once contained within the vacuum chamber, a physical vapor deposition process may proceed.

In another particular embodiment of the present invention, the plating rack of the present invention includes a central threaded shaft. A series of spaced apart component support assemblies are secured to the central threaded shaft. At least one of the component support assemblies includes a surrounding frame that extends around the central threaded shaft and includes opposed terminal ends that terminate in spaced apart relationship so as to define an opening therebetween that permits the central threaded shaft to pass through the opening when the component support assembly is being secured to the central threaded shaft. At least one component support assembly further includes a central support having a slot having an open end, and there is provided a plurality of connectors that interconnect the central support with the surrounding frame. An array of component supports are secured to the surrounding frame and supported thereby such that various products or components to be plated can be supported by the component supports. Finally, there is provided in this particular embodiment, a series of threaded supports disposed in pairs with each pair being adapted to engage and support a respective component support assembly.

One advantage of the present invention is that various types and designs of component or product support assemblies can be easily and conveniently attached to the main support member. Because the frames include the side openings, it follows that the frames can simply be laterally moved onto or off from the central support member. Therefore, various types of component support assemblies can be mixed and matched and supported on the main support member at various space relationships.

DETAILED DESCRIPTION OF THE INVENTION

Figure 1:
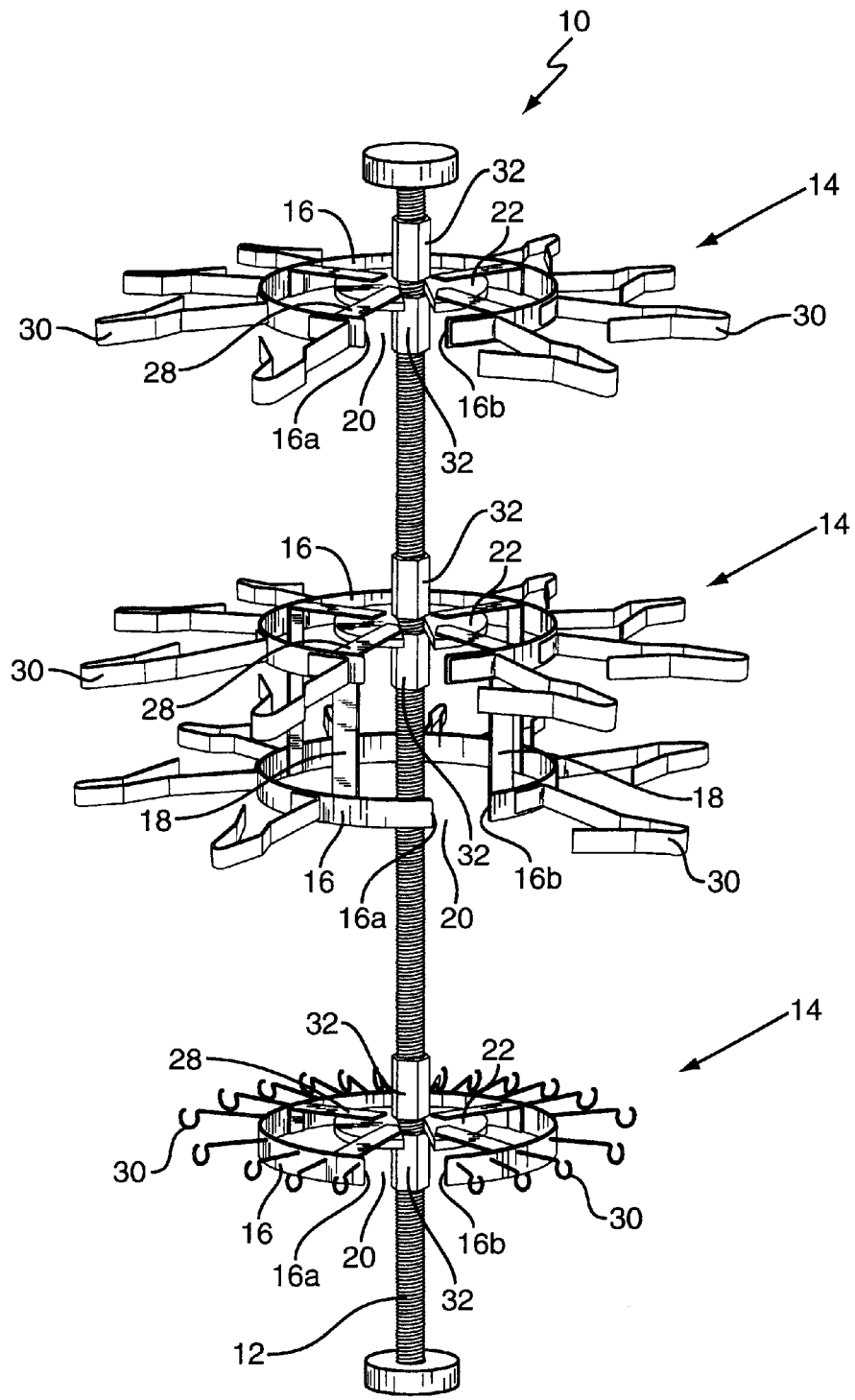
FIG. 1 is a perspective view of the plating rack of the present invention.
Figure 2:
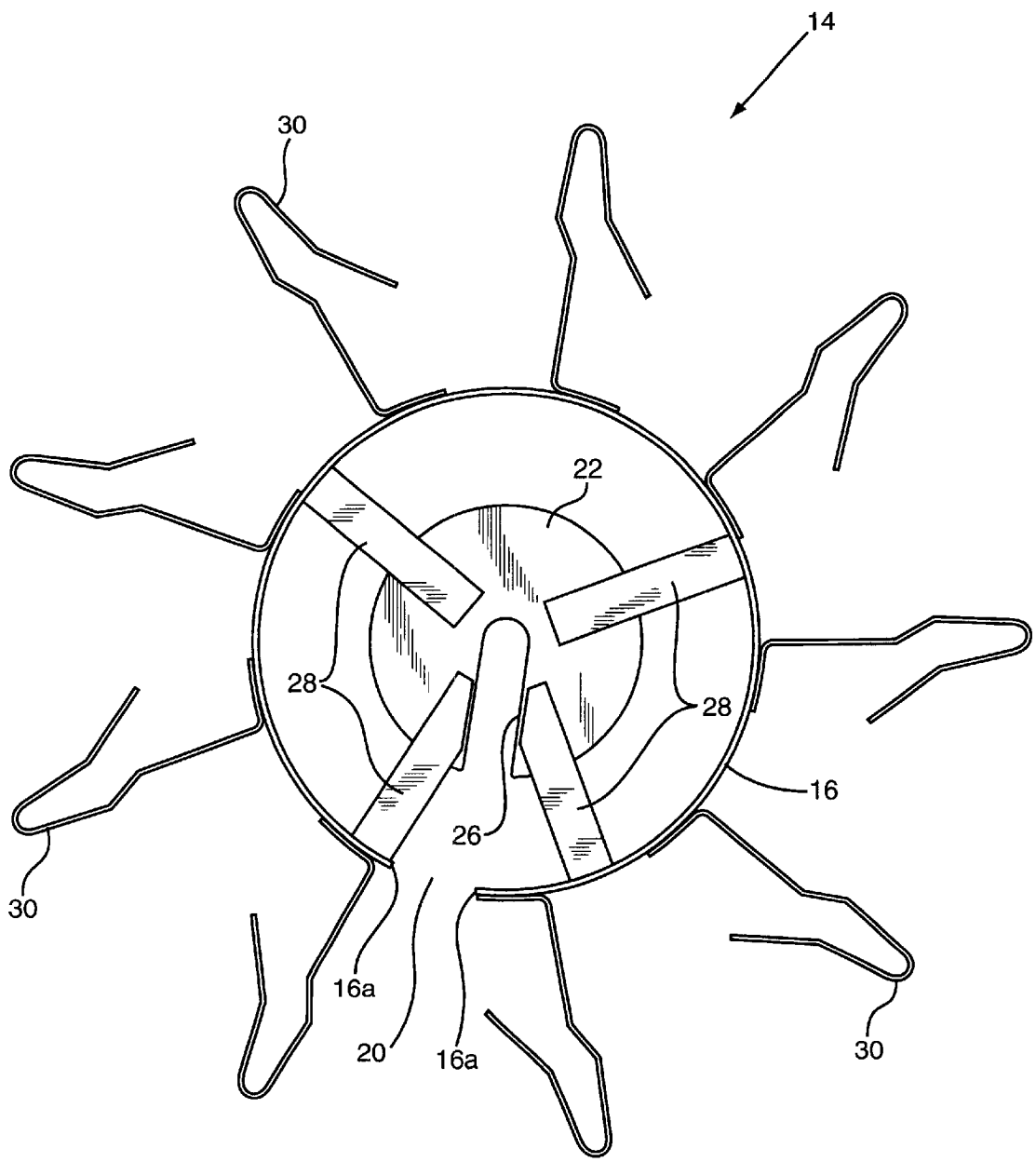
FIG. 2 is a top plan view of one embodiment of the component support assembly that forms a part of the plating rack.
Figure 3:
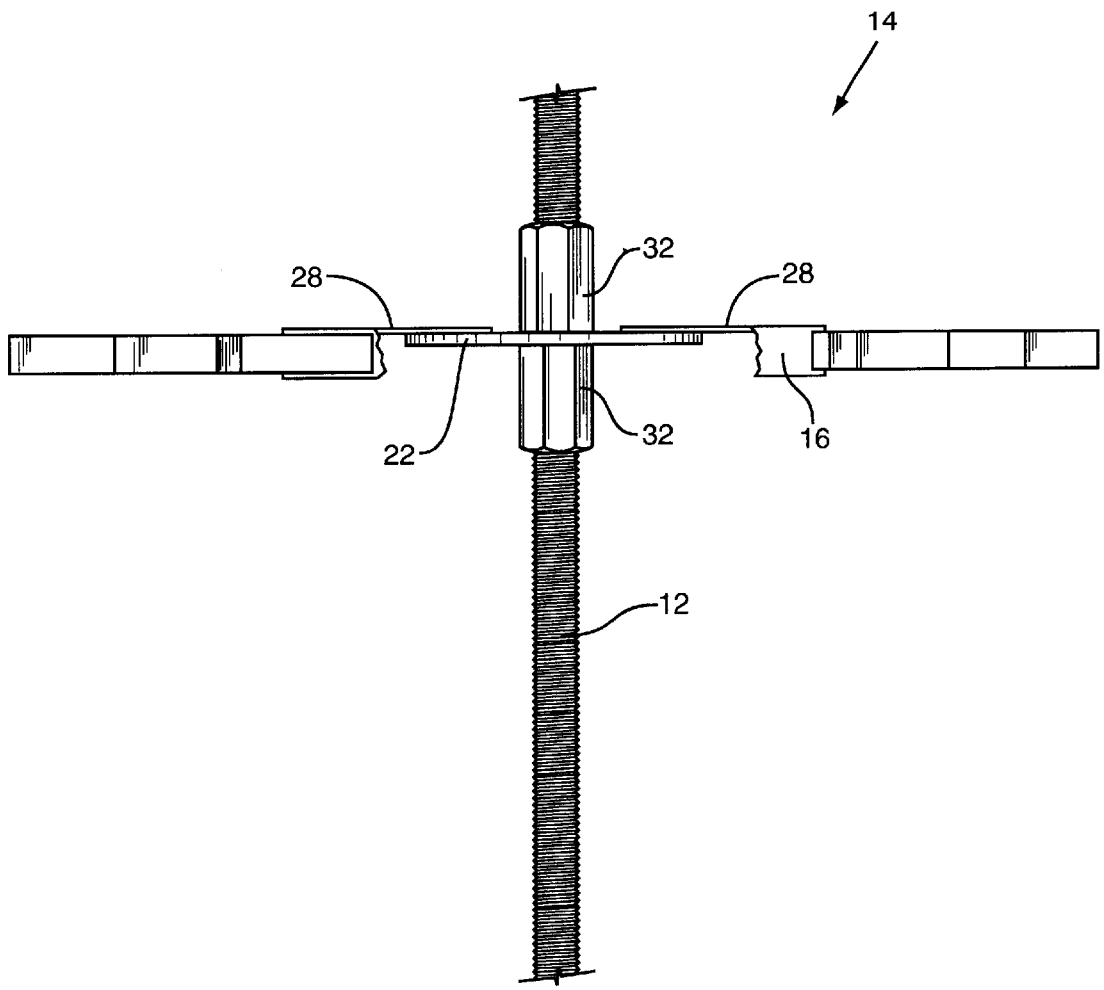
FIG. 3 is a fragmentary elevational view showing a portion of one component support assembly of the plating rack.

With further reference to the drawings, the plating rack of the present invention is shown therein and indicated generally by the numeral 10. Plating rack 10 comprises a main support member 12. Main support member 12 may assume various forms. In the embodiment illustrated herein, the main support member 12 comprises a central threaded shaft. The opposed ends of the central threaded shaft 12 may be adapted to fit within an appropriate receiving structure that is conventionally found in plating systems. That is, as will be described later, in one exemplary use of the plating rack 10 of the present invention, the plating rack is placed within a vacuum chamber and while in the vacuum chamber supports parts or components to be plated by a plating process such as, for example, a physical vapor deposition (PVD) process. Therefore, it should be understood that the rack 10 itself will be adapted to fit within a plating chamber.

Secured on the main support member 12 is a series of axially spaced component support assemblies indicated generally by the numeral 14. As will be appreciated from subsequent portions of this disclosure, these component support assemblies 14 are adapted to receive and hold products, parts or components that are to be plated. It should be appreciated that the component support assembly 14 can vary in design to accommodate various different types of parts, products, or components.

Viewing the component support assembly 14 in more detail it is seen that the same includes one or more frames 16 that extend substantially around the main support member 12. In the embodiment illustrated herein, the frame 16 comprises generally circular rings or bands that are spaced outwardly from the main support member 12 and which generally extend around the main support member 12 in a circular fashion. Each component support assembly 12 can include one or more frames. For example, in the illustration shown in FIG. 1, the upper and lower component assemblies include a single frame while the middle component support assembly comprises two vertically spaced frames 16. It should be appreciated that a component support assembly could even include three or more vertically spaced frames or bands 16. In the case where the component support assembly 14 comprises more than one frame, the respective frames may be connected by vertical connectors 18.

The component support assembly 14 is designed such that it can be easily connected to and disconnected from the main support member 12. This is achieved by effectively designing the component support assembly such that it includes a side opening that enables the entire component support assembly 14 to be laterally inserted onto the main support member 12. To achieve this, each of the bands or frames 16 of the component support assembly 14 includes opposed terminal ends 16a and 16b. These two terminal ends formed on each band or frame 16 forms a side opening 20 in the entire component support assembly 14. As will be understood from subsequent portions of the disclosure, the side opening 20 formed in the frame or frames 16 of a component support assembly 14 enables that entire component support assembly to be placed onto the main support member 12 by simply passing the main support member 12 through the one or more openings 20.

Continuing to refer to the component support assembly 14, the same comprises a central support 22 that is adapted to be held and supported on the main support member 12. The central support 22 can assume various forms. For example, the central support 22 may include a plate or washer or the like. In the embodiment illustrated herein, the central support 22 assumes the form of a plate and includes an elongated slot 26 formed therein. Note that the elongated slot 26 includes an open end.

Central support 22 is coupled to an outer frame or band 16 by a plurality of radial connectors 28. Thus, it is seen that the bands or frames 18 are effectively connected to and supported by the central support 22.

Secured to each frame or band 16 is an array of component supports 30. These component supports serve to receive and hold parts, products and components that are to be plated. As illustrated in the drawings, these component supports 30 can assume various forms. They are generally supported in cantilever fashion from the bands or frames 16. In the case of the embodiment illustrated herein, the component supports 30 assume the form of spring clips and hooks. More particularly, the component supports 30 formed on the upper two component support assemblies 14 in FIG. 1 are of the spring clip type. The component supports extending from the lower component support assembly 14 in FIG. 1 assumed the form of hooks. The spring clips function to receive and hold parts or components to be plated. For example, a knob for a plumbing faucet can be inserted over the terminal end of a spring clip and the spring clip will effectively hold and support the knob or handle. It is to be appreciated that other forms of component supports can be connected to the bands or frames 16 of respective component support assemblies 14.

To support the component support assemblies 14 on the main support member 12, there is provided a series of supports 32 that are adapted to be secured on the main support member 12 and to engage and hold the component support assemblies 14. These supports 32 in the embodiment illustrated herein are threaded supports in the form of elongated nuts. These threaded supports 32 work in pairs. As illustrated in the drawings, a pair of threaded supports 32 are spaced apart a sufficient distance to enable the central support 22 and the elongated slot 26 formed therein to be slipped over the threaded shaft 12 such that the pair of threaded supports 32 are disposed on opposite sides of the central support 22. Thereafter, at least one of the threaded supports 32 is moved downwardly into engagement with the central support 22. In fact, the pair of threaded supports 32 can be tightened down on the central support 22 so as to secure the same at a certain position on the main support member 12.

Figure 4:
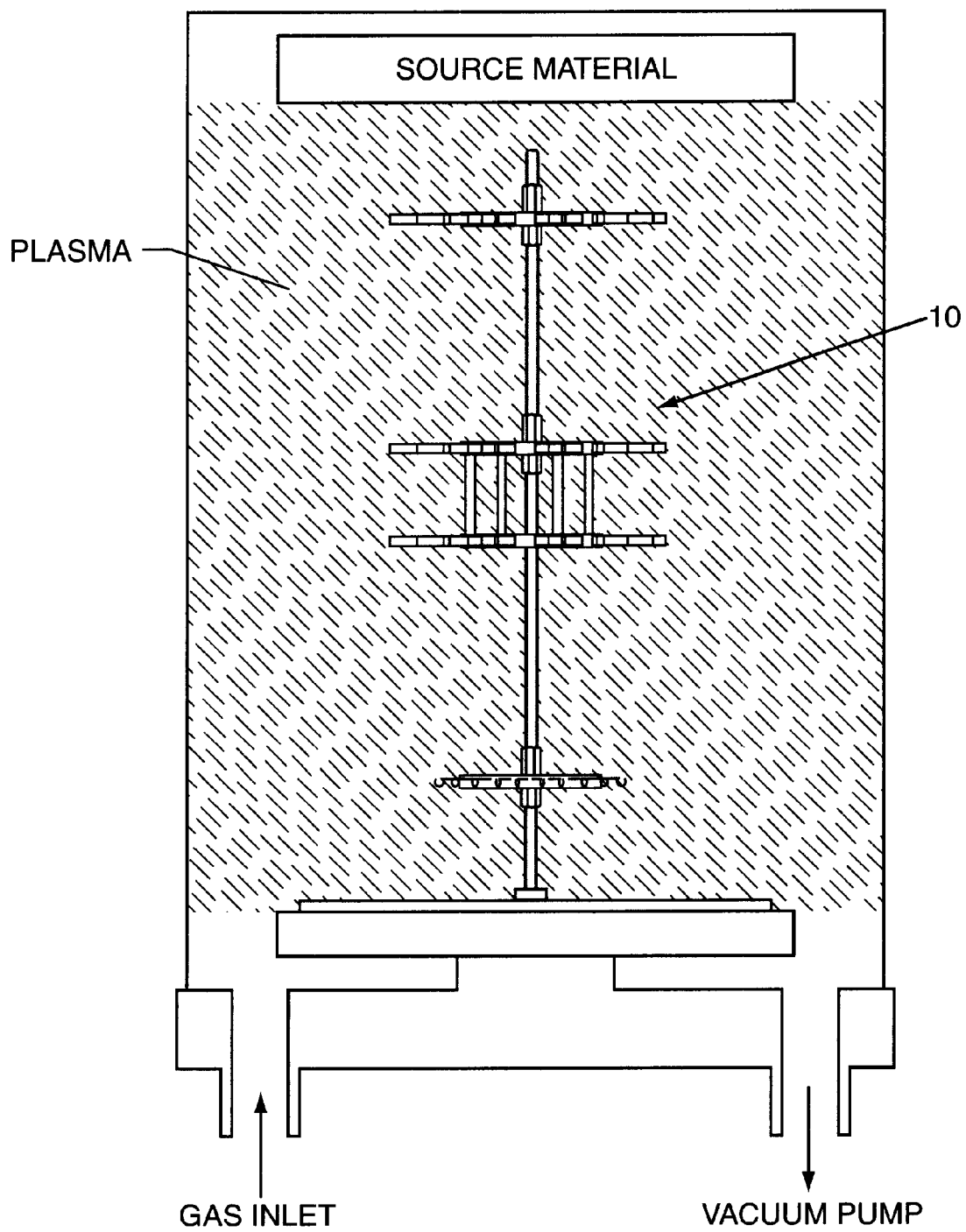
FIG. 4 is a schematic illustration of the plating rack disposed within a plating chamber.

As discussed above, the plating rack 10 of the present invention is particularly designed to support products, parts and components within a chamber or an enclosure for the purpose of plating the products, parts or components. The plating rack 10 of the present invention may be used in various types of plating processes. For example, the plating rack 10 of the present invention is suited to be utilized in a PVD process. In such a process the plating rack 10 would be placed within a vacuum chamber 50 illustrated in FIG. 4. Vacuum chamber 50 would be provided with a gas inlet and a vacuum pump port. Details of the plating process are not dealt with here because such is not per se material to the present invention and further, plating processes such as the PVD processes are well-known. However, briefly in the case of a PVD process, a source or target material is placed within the vacuum chamber 50 and metallic ions are removed from the source material and reacted with a gas to form a ceramic compound which is deposited on the surface of the products, parts or components supported by the plating rack 10 disposed within the vacuum chamber 50. Before being introduced into the plating chamber or the vacuum chamber 50, the components to be plated are dried. These components generally undergo cleaning by ionic etching under the influence of argon, and then the parts or components are bombarded with a high density metallic plasma which produces the coating.

The plating rack of the present invention has many advantages. One advantage is that the plating rack 10 is very versatile and enables various types of component support assemblies to be easily connected to the main support member 12 and easily removed from the main support member 12. Again, this is achieved by the design of the bands or frames 16 that provide for the side opening 20 in the component support assemblies 14. This means that any type of component support assembly can be simply mounted on the main support member 12 by inserting the main support member 12 through the side opening 20 within the component support assembly 14 and then securing the central support 22 between a pair of threaded supports 32. Further, since the threaded support 32 can be moved up and down on the main support member 12, it follows that the respective component support assemblies 14 can be positioned at any location desired on the support member 12. Also it follows that the respective component support assemblies 14 can be spaced at any spatial relationship desired. By the same token, these components support assemblies 14 can be easily removed from the main support member 12. This gives the user a great deal of flexibility. It enables the user to form a custom plating rack by simply adding and deleting certain component support assemblies 14. It avoids the user having to repeatedly make special orders for plating racks to accommodate certain types and designs of products, parts and components to be plated.

As used herein, the term "component" simply means any product, part or device that is to be plated.

The present invention may, of course, be carried out in other specific ways than those herein set forth without departing from the scope and the essential characteristics of the invention. The present embodiments are therefore to be construed in all aspects as illustrative and not restrictive and all changes coming within the meaning and equivalency range of the appended claims are intended to be embraced therein.

What is claimed is:

1. A rack for supporting components to be plated and adapted to be disposed within a plating chamber, comprising:
   a central threaded shaft;
   a series of spaced-apart component support assemblies secured to the central threaded
   shaft for supporting an array of components to be plated;
   at least one component support assembly including:
   (i) a surrounding frame that extends around the central threaded shaft and includes opposed terminal ends that terminate in spaced-apart relationship so as to define an opening therebetween that permits the central threaded shaft to pass through the opening when the component support assembly is being secured to the central threaded shaft;
   (ii) a central support having an open slot formed therein that enables the central slot to slide laterally around the central threaded shaft;
   (iii) a plurality of connectors extending from the central support outwardly to the surrounding frame such that the surrounding frame is supported by the central support; and
   (iv) an array of component supports secured to the surrounding frame and supported thereby, each component support being adapted to receive and support a component to be plated;
   a series of threaded support members mounted on the central threaded shaft and movable up and down thereon;
   the series of threaded supports disposed in pairs and wherein each pair of threaded supports are spaced apart and adapted to engage and support a respective component support assembly; and
   when each pair of threaded supports is adapted to assume a spaced apart relationship such that the central support can be extended between the pair of threaded supports and at least one of the pair of threaded supports can be screwed down onto the central support so as to secure the central support between the pair of threaded supports.

2. The rack of claim 1 wherein at least one component support assembly includes at least two surrounding frames and wherein there are provided connectors that extend between the surrounded frames such that the two surrounding frames are interconnected together.

3. The rack of claim 1 wherein the surrounding frames of respective component support assemblies extends substantially around the central threaded shaft.

4. The rack of claim 3 wherein the respective surrounding frames assume a generally curved configuration.

5. The rack of claim 1 wherein the central support includes a generally flat plate having the slot formed therein; and wherein the slot includes an elongated slot having a side opening that permits the flat plate and slot to be inserted around the central threaded shaft.

6. A method of plating components including securing components to the rack of claim 1 and placing the rack in a vacuum chamber and plating the components supported by the rack by a physical vapor deposition process.

7. The method of claim 6 including securing the components to be plated on the array of component supports that are supported by the surrounding frame.

8. The method of claim 6 including varying the configuration of the rack by removing and adding various component support assemblies to the rack by removing one component rack assembly by passing the central threaded shaft through the opening formed between the terminal ends of the surrounding frame of the central support assembly, and by inserting another central support assembly onto the central threaded shaft by passing the central threaded shaft through the opening formed between the opposed ends of the surrounding frame of the second central support assembly.

9. A method of adjusting the number of component support assemblies secured on the rack of claim 1 including removing one or more component support assemblies by laterally moving the component support assembly from the central threaded shaft by passing the central threaded shaft through the opening defined between the opposed terminal ends of the surrounding frame of the component support assembly, or adding one or more component support assemblies to the central threaded shaft by laterally moving the central support assembly onto the central threaded shaft by passing the central threaded shaft through the opening defined between the opposed ends of the surrounding frame of the component support assembly.

10. A method of adjusting the axial position of one or more of the component support assemblies mounted on the rack of claim 1 including moving a pair of the threaded supports upwardly or downwardly on the central threaded shaft and stationing a component support assembly between the pair of threaded supports at a desired location on the central threaded shaft.

11. A plating rack for supporting components to be plated, comprising:
   an elongated main support member;
   a series of spaced apart component support assemblies mounted to said main support member;

at least one of said components support assemblies includes a frame that extends substantially around the main support member;

the frame including a pair of opposed end portions that are spaced apart and which define an opening therebetween that allows the elongated main support member to pass through the opening when mounting or removing the component support assembly from the main support member;

a support structure mounted on the main support member for supporting the component support assemblies; and an array of component supports secured to the frames of the component support assemblies for supporting components to be plated.

12. A physical vapor deposition system comprising: a vacuum chamber and wherein there is disposed within the vacuum chamber the plating rack of claim 11 whereby components secured to the component supports and supported by the rack may be subjected to plating within the vacuum chamber.

13. A method of interchanging component support assemblies on the rack of claim 11 including, in the case of removing a component rack assembly from the main support member, laterally moving the component support assembly away from the main support member by passing the main support member through the opening formed between the terminal end portions of the frame, and in the case of adding a component support assembly to the main support member, laterally moving the component support assembly towards the main support member and passing the main support member between the opening formed by the opposed terminal ends of the frame.

14. The method of claim 13 including adjustably moving at least one component support assembly axially on the elongated main support member.

15. The method of claim 14 further including stationing at least one of the component support assemblies to the main support member by providing an upper and lower support wherein the upper and lower supports are movable axially on the main support member and which are adapted to receive a portion of the component support assembly between the two supports and to hold the component support assembly therebetween.

16. The rack of claim 11 wherein the main support member includes at least one threaded portion and wherein the support structure includes a series of threaded supports secured on the threaded portion of the main support member and wherein the threaded supports are disposed in pairs with each pair of threaded supports being adapted to receive therebetween a portion of a respective component support assembly.

17. The plating rack of claim 11 wherein at least one component support assembly includes a central support having a slot with an open end formed therein that enables the central support to be inserted around the main support structure via the slot.

18. The plating rack of claim 17 including a series of connectors extending from the central support to the frame such that the connectors connect the central support to the frame.

19. In a physical vapor deposition system for plating components, including a vacuum chamber and a plating rack adapted to be disposed within the vacuum chamber for holding components to be plated by the physical vapor deposition system, the plating rack comprising an elongated support member; a series of spaced apart component support assemblies secured to the main support member; at least one of said component support assemblies including a frame that extends substantially around the main support member; the frame including a pair of opposed end portions that are spaced apart and which define an opening therebetween that allows the elongated main support member to pass therethrough when the component support assembly is being mounted to or removed from the main support member; a support structure mounted on said main support member for supporting at least one component support assembly; and an array of component supports secured to the frame and extending therefrom for receiving and holding components to be plated by the vapor deposition system.

20. The vapor deposition system of claim 19 wherein at least one component support assembly includes a central support having a slot formed therein with the slot having an open end that enables the central support to be extended via the open ended slot around the main support member.

21. The vapor deposition system of claim 20 wherein the slot formed in the central support is an elongated slot and wherein the elongated slot is disposed such that the elongated slot is generally aligned with the opening defined between the two opposed terminal ends of the frame.

22. The vapor deposition system of claim 20 including a series of generally radially extending connectors that connect to the central support and project therefrom to where the connectors connect to the frame.

23. The physical vapor deposition system of claim 19 wherein the frame of at least one component support assembly includes at least two spaced apart rings that extend substantially around the main support member and wherein each of the rings include opposed terminal end portions that are spaced apart so as to define an opening therebetween.

* * * * *